United States Patent
Walther et al.

(10) Patent No.: US 7,396,746 B2
(45) Date of Patent: Jul. 8, 2008

(54) METHODS FOR STABLE AND REPEATABLE ION IMPLANTATION

(75) Inventors: Steven R. Walther, Andover, MA (US); Ziwei Fang, Beverly, MA (US); Justin Tocco, Gloucester, MA (US); Carleton F. Ellis, III, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 310 days.

(21) Appl. No.: 10/852,643

(22) Filed: May 24, 2004

(65) Prior Publication Data

US 2005/0260837 A1    Nov. 24, 2005

(51) Int. Cl.
*H01L 21/425* (2006.01)
(52) U.S. Cl. ............... 438/515; 438/514; 257/E21.334
(58) Field of Classification Search ............... 438/514, 438/515; 118/723 E, 723 R; 257/E21.334
See application file for complete search history.

(56) References Cited

U.S. PATENT DOCUMENTS

| | | | |
|---|---|---|---|
| 5,354,381 A | 10/1994 | Sheng | |
| 5,498,290 A * | 3/1996 | Matossian et al. | 118/723 E |
| 5,508,227 A | 4/1996 | Chan et al. | |
| 5,911,832 A | 6/1999 | Denholm et al. | |
| 6,020,592 A | 2/2000 | Liebert et al. | |
| 6,182,604 B1 | 2/2001 | Goeckner et al. | |
| 6,383,554 B1 | 5/2002 | Chang et al. | |
| 2004/0016402 A1 | 1/2004 | Walther et al. | |
| 2005/0051271 A1 * | 3/2005 | Collins et al. | 156/345.31 |

FOREIGN PATENT DOCUMENTS

| | | |
|---|---|---|
| EP | 0942453 A | 9/1999 |
| EP | 1 111 084 A1 | 6/2001 |

OTHER PUBLICATIONS

S. Qin, et al: "High Dose Rate Hydrogen Plasma Ion Implantation", Surface & Coatings Technology, vol. 85, No. 1-2, Nov. 1, 1996, pp. 56-59, XP002366734, Elsevier Switzerland.
Chun M., et al: "High Dose Rate Effects in Silicon by Plasma Source Ion Implantation", Journal of Vacuum Science & Technology B: Microelectronics Processing and Phenomena; American Vacuum Society, New York, NY, US, vol. 17, No. 2, Mar. 1999, pp. 863-866, XP012007478.
B. Linder, N. Cheung: "Plsama Immersion Ion Implantation with Dielectric Substrates", IEEE Transactions on Plasma Science, vol. 24, No. 6, Dec. 1996, pp. 1383-1388, XP011044754.

* cited by examiner

*Primary Examiner*—Bradley K Smith

(57) ABSTRACT

A method for plasma ion implantation of a substrate includes providing a plasma ion implantation system having a process chamber, a source for producing a plasma in the process chamber, a platen for holding a substrate in the process chamber, an anode spaced from the platen, and a pulse source for generating implant pulses for accelerating ions from the plasma into the substrate. In one aspect, a parameter of an implant process is varied to at least partially compensate for undesired effects of interaction between ions being implanted and the substrate. For example, dose rate, ion energy, or both may be varied during the implant process. In another aspect, a pretreatment step includes accelerating ions from the plasma to the anode to cause emission of secondary electrons from the anode, and accelerating the secondary electrons from the anode to a substrate for pretreatment of the substrate.

7 Claims, 7 Drawing Sheets

METHODS FOR STABLE AND REPEATABLE ION IMPLANTATION

FIELD OF THE INVENTION

This invention relates to systems and methods for plasma ion implantation of substrates and, more particularly, to methods for at least partially compensating for undesired effects of interaction between ions being implanted and substrates.

BACKGROUND OF THE INVENTION

Ion implantation is a standard technique for introducing conductivity-altering impurities into semiconductor wafers. In a conventional beamline ion implantation system, a desired impurity material is ionized in an ion source, the ions are accelerated to form an ion beam of prescribed energy, and the ion beam is directed at the surface of the wafer. Energetic ions in the beam penetrate into the bulk of the semiconductor material and are embedded into the crystalline lattice of the semiconductor material to form a region of desired conductivity.

A well-known trend in the semiconductor industry is toward smaller, higher speed devices. In particular, both the lateral dimensions and the depths of features in semiconductor devices are decreasing. The implanted depth of the dopant material is determined, at least in part, by the energy of the ions implanted into the semiconductor wafer. Beamline ion implanters are typically designed for efficient operation at relatively high implant energies and may not function efficiently at the low energies required for shallow junction implantation.

Plasma doping systems have been studied for forming shallow junctions in semiconductor wafers. In a plasma doping system, a semiconductor wafer is placed on a conductive platen, which functions as a cathode and is located in a process chamber. An ionizable process gas containing the desired dopant material is introduced into the chamber, and a voltage pulse is applied between the platen and an anode or the chamber walls, causing formation of a plasma having a plasma sheath in the vicinity of the wafer. The applied pulse causes ions in the plasma to cross the plasma sheath and to be implanted into the wafer. The depth of implantation is related to the voltage applied between the wafer and the anode. Very low implant energies can be achieved. Plasma doping systems are described, for example, in U.S. Pat. No. 5,354,381, issued Oct. 11, 1994 to Sheng; U.S. Pat. No. 6,020,592, issued Feb. 1, 2000 to Liebert et al.; and U.S. Pat. No. 6,182,604, issued Feb. 6, 2001 to Goeckner et al.

In the plasma doping systems described above, the applied voltage pulse generates a plasma and accelerates positive ions from the plasma toward the wafer. In other types of plasma systems, known as plasma immersion systems, continuous or pulsed RF energy is applied to the process chamber, thus producing a continuous or pulsed plasma. At intervals, negative voltage pulses, which may be synchronized with the RF pulses, are applied between the platen and the anode, causing positive ions in the plasma to be accelerated toward the wafer.

A surface to be implanted may interact with the ions being implanted in an undesired way. For example, ion implantation may produce charging of insulating or semi-insulating structures on the surface of a substrate. Films or layers, such as photoresist masks, on the substrate surface may release gases and change composition during implantation. The photoresist may be an insulator at the start of an implant and may become more conductive as the implant progresses. These effects may cause unstable and/or non-repeatable implant conditions.

Prior art approaches to dealing with these issues in plasma ion implantation include pretreating the photoresist with ultraviolet light or baking to reduce outgassing. Also, the photoresist can be pretreated by plasma ion implantation of an inert ion species or by plasma immersion, where the substrate is biased positive to extract electrons from the plasma and these extracted electrons pretreat the photoresist. These approaches require an additional process step prior to ion implantation of the dopant material and thus reduce throughput.

Beamline ion implantation systems have used lower initial beam current to reduce photoresist effects. This approach applies to beamline systems and has a disadvantage of changing the spatial charge distribution of the beam and thus impacting the implant uniformity and the implant defect generation that may be dependent upon instantaneous dose rate. The beamline approach can also lead to charge neutralization difficulties, as neutralization systems such as an electron flood gun may be optimized for a specific beam current condition.

SUMMARY OF THE INVENTION

According to a first aspect of the invention, a method is provided for plasma ion implantation of a substrate. The method comprises providing a plasma ion implantation system including a process chamber, a source for producing a plasma in the process chamber, a platen for holding a substrate in the process chamber, and a pulse source for generating implant pulses for accelerating ions from the plasma into the substrate, plasma ion implantation of the substrate according to an implant process having a dose rate, and varying the dose rate during the implant process.

According to a second aspect of the invention, a method is provided for plasma ion implantation of a substrate. The method comprises providing a plasma ion implantation system including a process chamber, a source for generating a plasma in the process chamber, a platen for holding a substrate in the process chamber, an anode spaced from the platen, and a pulse source for generating implant pulses for accelerating ions from the plasma into the substrate; accelerating ions from the plasma to the anode to cause emission of secondary electrons from the anode; accelerating the secondary electrons from the anode to the substrate; and plasma ion implantation of the substrate according to an implant process.

According to a third aspect of the invention, a method is provided for plasma ion implantation of a substrate. The method comprises providing a plasma ion implantation system including a process chamber, a source for producing a plasma in the process chamber, a platen for holding a substrate in the process chamber, and a pulse source for generating implant pulses for accelerating ions from the plasma into the substrate; plasma ion implantation of the substrate according to an implant process; and adjusting ion energy during the implant process to at least partially compensate for an undesired effect of interaction between ions being implanted and the substrate.

According to a fourth aspect of the invention, a plasma ion implantation system comprises a process chamber; a source for producing a plasma in the process chamber; a platen for holding a substrate in the process chamber; a pulse source for generating implant pulses for accelerating ions from the plasma into the substrate; and an implant controller configured for plasma ion implantation of the substrate according to an implant process having a dose rate and for varying the dose rate during the implant process.

According to a fifth aspect of the invention, a plasma ion implantation system comprises a process chamber; a source for generating a plasma in the process chamber; a platen for holding a substrate in the process chamber; an anode spaced from the platen; a pulse source for generating implant pulses for accelerating ions from the plasma into the substrate; and a power supply for accelerating ions from the plasma to the anode to cause emission of secondary electrons from the anode and for accelerating the secondary electrons from the anode to the substrate.

According to a sixth aspect of the invention, a plasma ion implantation system comprises a process chamber; a source for producing a plasma in the process chamber; a platen for holding a substrate in the process chamber; a pulse source for generating implant pulses for accelerating ions from the plasma into the substrate; and an implant controller configured for plasma ion implantation of the substrate according to an implant process and for adjusting ion energy during the implant process to at least partially compensate for an undesired effect of interaction between ions being implanted and the substrate.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
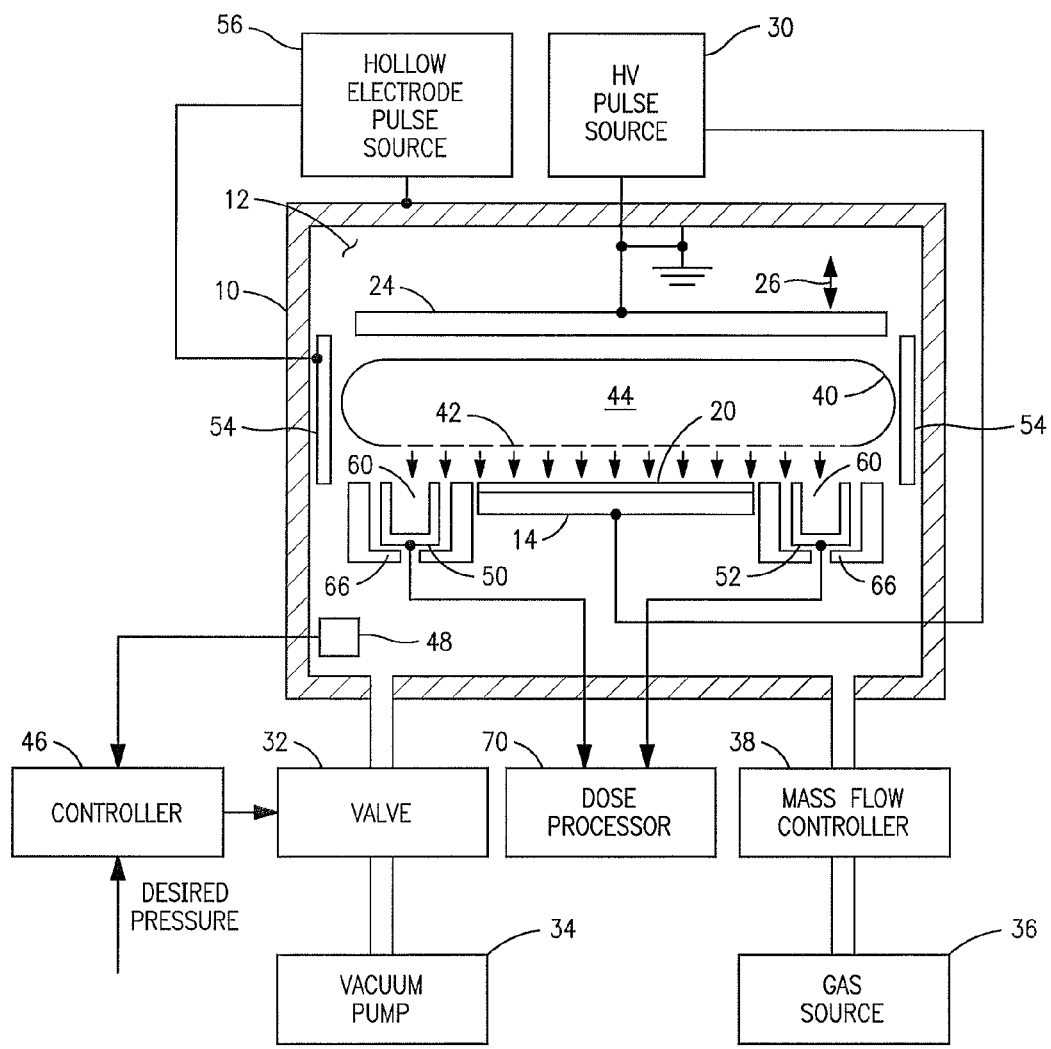
FIG. 1 is a simplified schematic block diagram of a plasma ion implantation system.

An example of a plasma ion implantation system suitable for implementation of the present invention is shown schematically in FIG. 1. Embodiments of the invention are described in connection with FIGS. 2-7. Like elements in FIGS. 1-7 have the same reference numerals.

A process chamber 10 defines an enclosed volume 12. A platen 14 positioned within chamber 10 provides a surface for holding a substrate, such as a semiconductor wafer 20. The wafer 20 may, for example, be clamped at its periphery to a flat surface of platen 14. In one embodiment, the platen has an electrically conductive surface for supporting wafer 20. In another embodiment, the platen includes conductive pins (not shown) for connection to wafer 20.

An anode 24 is positioned within chamber 10 in spaced relation to platen 14. Anode 24 may be movable in a direction, indicated by arrow 26, perpendicular to platen 14. The anode is typically connected to electrically conductive walls of chamber 10, both of which may be connected to ground. In another embodiment, platen 14 is connected to ground, and anode 24 is pulsed to a negative voltage. In further embodiments, both anode 24 and platen 14 may be biased with respect to ground.

The wafer 20 (via platen 14) and the anode 24 are connected to a high voltage pulse source 30, so that wafer 20 functions as a cathode. The pulse source 30 typically provides pulses in a range of about 20 to 20,000 volts in amplitude, about 1 to 200 microseconds in duration and a pulse repetition rate of about 100 Hz to 20 kHz. It will be understood that these pulse parameter values are given by way of example only and that other values may be utilized within the scope of the invention.

The enclosed volume 12 of chamber 10 is coupled through a controllable valve 32 to a vacuum pump 34. A process gas source 36 is coupled through a mass flow controller 38 to chamber 10. A pressure sensor 48 located within chamber 10 provides a signal indicative of chamber pressure to a controller 46. The controller 46 compares the sensed chamber pressure with a desired pressure input and provides a control signal to valve 32 or mass flow controller 38. The control signal controls valve 32 or mass flow controller 38 so as to minimize the difference between the chamber pressure and the desired pressure. Vacuum pump 34, valve 32, mass flow controller 38, pressure sensor 48 and controller 46 constitute a closed loop pressure control system. The pressure is typically controlled in a range of about 1 millitorr to about 500 millitorr, but is not limited to this range. Gas source 36 supplies an ionizable gas containing a desired dopant for implantation into the workpiece. Examples of ionizable gas include $BF_3$, $N_2$, Ar, $PH_3$, $AsH_3$ and $B_2H_6$. Mass flow controller 38 regulates the rate at which gas is supplied to chamber 10. The configuration shown in FIG. 1 provides a continuous flow of process gas at a desired flow rate and constant pressure. The pressure and gas flow rate are preferably regulated to provide repeatable results. In another embodiment, the gas flow may be regulated using a valve controlled by controller 46 while valve 32 is kept at a fixed position. Such an arrangement is referred to as upstream pressure control. Other configurations for regulating gas pressure may be utilized.

The plasma doping system may include a hollow cathode 54 connected to a hollow cathode pulse source 56. In one embodiment, the hollow cathode 54 comprises a conductive hollow cylinder that surrounds the space between anode 24 and platen 14. The hollow cathode may be utilized in applications which require very low ion energies. In particular, hollow cathode pulse source 56 provides a pulse voltage that is sufficient to form a plasma within chamber 12, and pulse source 30 establishes a desired implant voltage. Additional details regarding the use of a hollow cathode are provided in the aforementioned U.S. Pat. No. 6,182,604, which is hereby incorporated by reference.

One or more Faraday cups may be positioned adjacent to platen 14 for measuring the ion dose implanted into wafer 20. In the embodiment of FIG. 1, Faraday cups 50, 52, etc. are equally spaced around the periphery of wafer 20. Each Faraday cup comprises a conductive enclosure having an entrance 60 facing plasma 40. Each Faraday cup is preferably positioned as close as is practical to wafer 20 and intercepts a sample of the positive ions accelerated from plasma 40 toward platen 14. In another embodiment, an annular Faraday cup is positioned around wafer 20 and platen 14.

The Faraday cups are electrically connected to a dose processor 70 or other dose monitoring circuit. Positive ions entering each Faraday cup through entrance 60 produce in the electrical circuit connected to the Faraday cup a current that is representative of ion current. The dose processor 70 may process the electrical current to determine ion dose.

The plasma ion implantation system may include a guard ring 66 that surrounds platen 14. The guard ring 66 may be biased to improve the uniformity of implanted ion distribution near the edge of wafer 20. The Faraday cups 50, 52 may be positioned within guard ring 66 near the periphery of wafer 20 and platen 14.

The plasma ion implantation system may include additional components, depending on the configuration of the system. Systems which utilize continuous or pulsed RF energy include an RF source coupled to an antenna or an induction coil. The system may include magnetic elements which provide magnetic fields that confine electrons and control plasma density and spatial distribution. The use of magnetic elements in plasma ion implantation systems is described, for example, in WO 03/049142, published 12 Jun. 2003, which is hereby incorporated by reference.

In operation, wafer 20 is positioned on platen 14. The pressure control system, mass flow controller 38 and gas source 36 produce the desired pressure and gas flow rate within chamber 10. By way of example, the chamber 10 may operate with $BF_3$ gas at a pressure of 10 millitorr. The pulse source 30 applies a series of high voltage pulses to wafer 20, causing formation of plasma 40 in a plasma discharge region 44 between wafer 20 and anode 24. As known in the art, plasma 40 contains positive ions of the ionizable gas from gas source 36. Plasma 40 includes a plasma sheath 42 in the vicinity, typically at the surface, of wafer 20. The electric field that is present between anode 24 and platen 14 during the high voltage pulse accelerates positive ions from plasma 40 across plasma sheath 42 toward platen 14. The accelerated ions are implanted into wafer 20 to form regions of impurity material. The pulse voltage is selected to implant the positive ions to a desired depth in wafer 20. The number of pulses and the pulse duration are selected to provide a desired dose of impurity material in wafer 20. The current per pulse is a function of pulse voltage, gas pressure and species and any variable position of the electrodes. For example, the cathode-to-anode spacing may be adjusted for different voltages.

Figure 2:
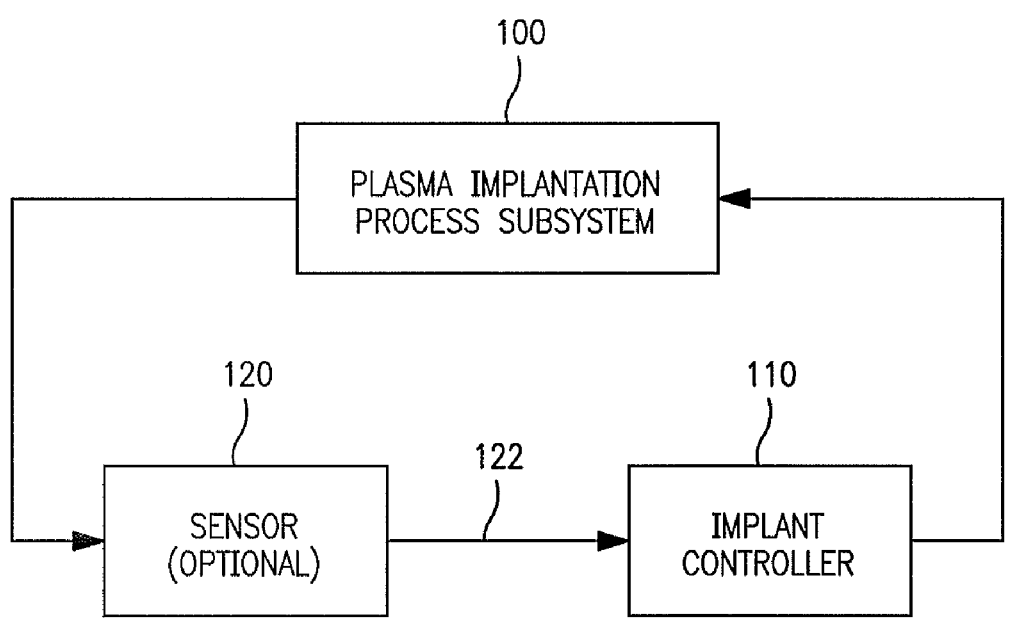
FIG. 2 is a simplified schematic block diagram of a plasma ion implantation system in accordance with a first embodiment of the invention.

A simplified schematic block diagram of a plasma ion implantation system in accordance with a first embodiment of the invention is shown in FIG. 2. A plasma implantation process subsystem 100 includes some or all of the plasma ion implantation system components shown in FIG. 1, except for process control components. An implant controller 110 controls process subsystem 100 to perform plasma ion implantation in accordance with an implant process.

The implant process may specify, for example, parameters such as ion species, ion energy, ion dose, dose rate, chamber pressure, implant pulse parameters, and the like. In some embodiments, implant controller 110 operates in an open loop configuration wherein parameters are preprogrammed. The implant parameters may be constant, or one or more of the parameters may have a preprogrammed variation during the implant process. In other embodiments, implant controller 110 may operate in a closed loop configuration wherein at least one optional sensor 120 senses a parameter of process subsystem 100 and provides a sensor signal 122 to implant controller 110. Implant controller 110 may adjust one or more parameters of process subsystem 100 in response to the sensor signal 122. In further embodiments, implant controller 110 may utilize a combination of preprogrammed control and closed loop feedback control.

Implant controller 110 may adjust parameters of the process subsystem 100, such as pulse width, pulse frequency, ion energy, plasma density, RF power, electric field, magnetic field and/or anode-to-cathode spacing, so as to control the implant process and in particular to control dose rate. Ion species and total dose are usually fixed for a particular process. The parameters that are not fixed may be adjusted separately or in any combination.

Dose rate may be adjusted by controlling a number of parameters, including but not limited to, implant pulse width, implant pulse frequency, or both. Ion energy may be adjusted by controlling implant pulse amplitude. Plasma density may be adjusted, for example, by controlling input power (DC or RF), electric field or cathode-to-anode spacing, or by controlling plasma confinement. Control of plasma density in turn controls dose rate. Parameters such as pulse width, pulse frequency and/or plasma density can be adjusted quickly and thereby permit dynamic control of dose rate during the implant process. Dose rate may be dynamically varied to at least partially compensate for undesired effects of interaction between ions being implanted and the substrate. Such effects include but are not limited to photoresist outgassing and substrate charging.

Implant controller 110 may be implemented as a general purpose computer (such as a PC), a process controller, or a special purpose controller that is programmed with the implant process. The implant process, including constant and variable parameters, may be stored in a memory.

Sensor 120 may sense various conditions within the process chamber, such as the surface condition of the substrate, outgassing from the substrate and/or substrate charging. For example, outgassing may be sensed by sensing pressure variations in the vicinity of the substrate. Techniques such as residual gas analysis (RGA) and optical emission spectroscopy (OES) may be utilized for sensing process chamber parameters. As noted above, one or more sensors may be utilized.

Figure 3:
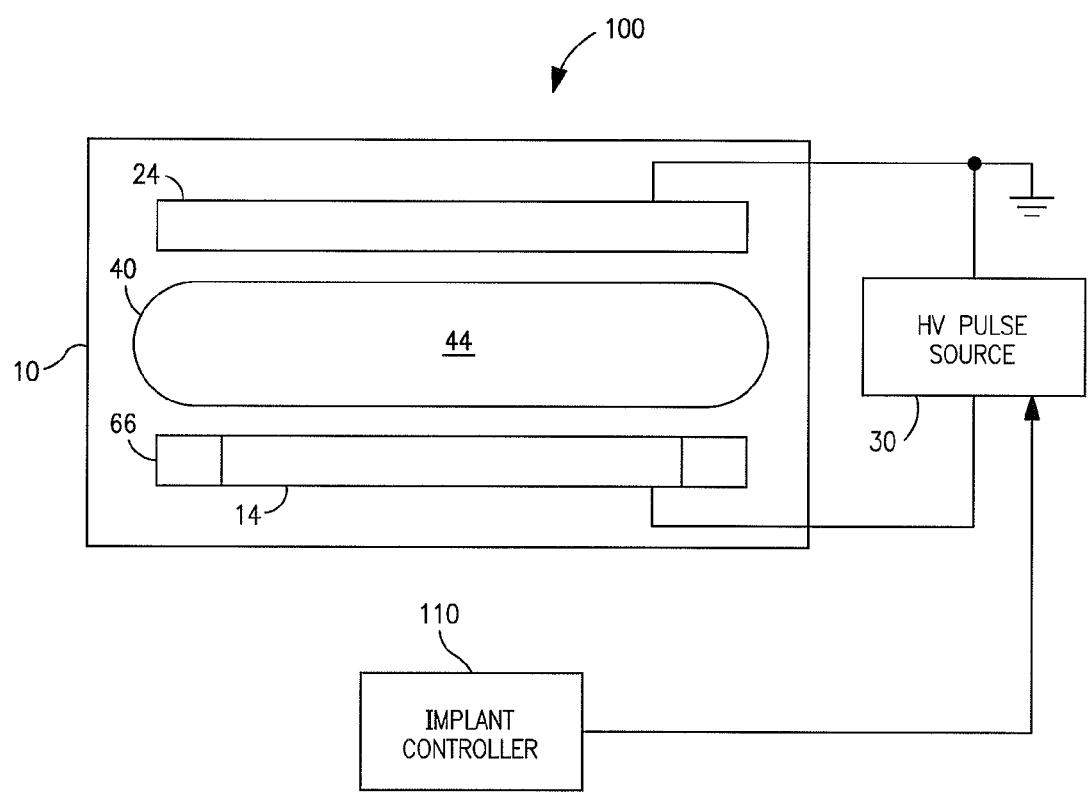
FIG. 3 is a simplified schematic block diagram of a plasma ion implantation system in accordance with a second embodiment of the invention.

A simplified schematic block diagram of a plasma ion implantation system in accordance with a second embodiment of the invention is shown in FIG. 3. In the embodiment of FIG. 3, implant controller 110 provides open loop control of pulse source 30 for controlling dose rate, ion energy, or both. By way of example, implant controller 110 may control dose rate according to a preprogrammed implant process. The implant pulse width may be adjusted dynamically to directly control the dose in each pulse by programming of pulse width as a function of time or implant dose. This allows the amount of charge implanted in each implant pulse to be optimized for the implant environment and the substrate surface condition. The pulse repetition frequency may be adjusted in the same manner to allow the time average dose rate to be adjusted. In some embodiments, both the pulse width and the pulse repetition frequency can be adjusted to achieve a desired variation in dose rate. In specific embodiments, the dose rate may be increased during plasma implantation of a single substrate. A low initial dose rate produces controlled outgassing from the photoresist and stabilizes the photoresist for subsequent implantation at a higher dose rate.

Figure 4A:
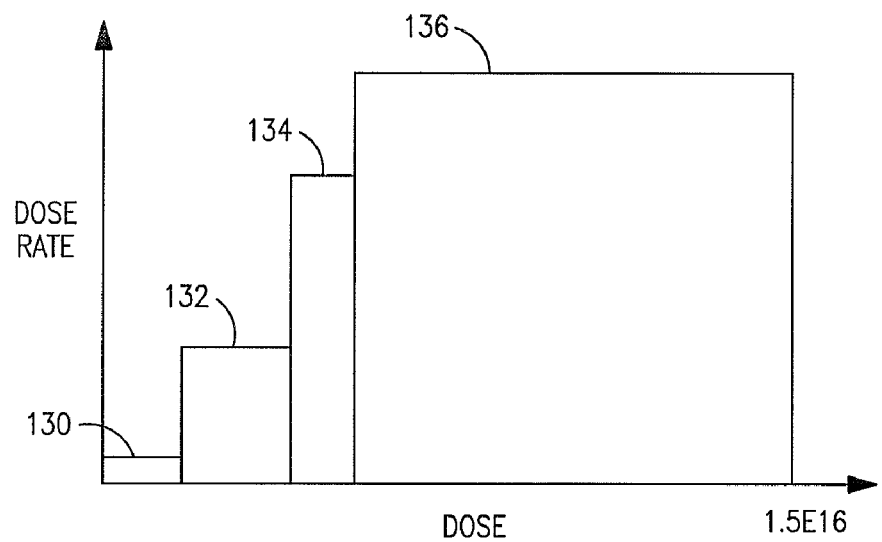
FIG. 4A is a graph of dose rate as a function of dose, illustrating a stepped increase in dose rate during plasma ion implantation of a substrate.
Figure 4B:
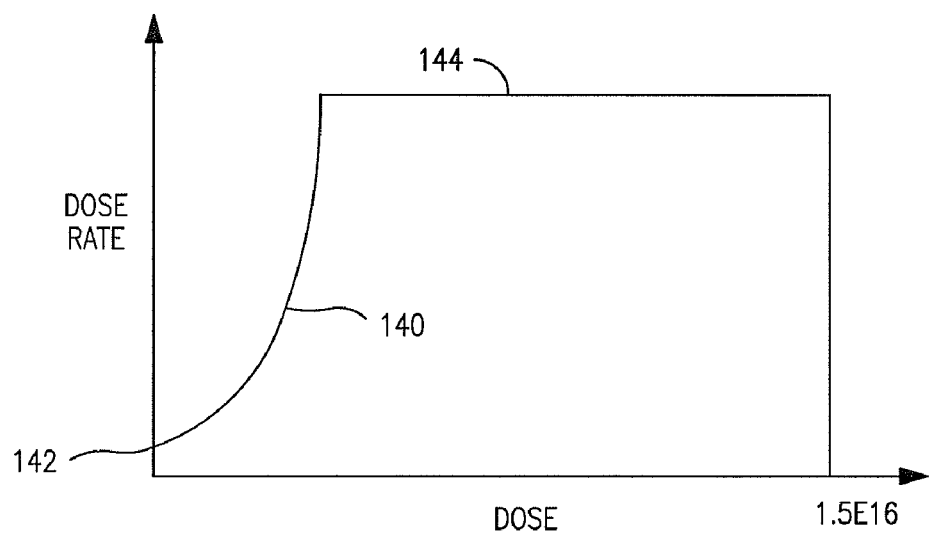
FIG. 4B is a graph of dose rate as a function of dose, illustrating a continuous increase in dose rate during plasma ion implantation of a substrate.

The dose rate may be adjusted in steps or continuously, for example. A first example of a variable dose rate is shown in FIG. 4A. Dose rate increases in steps 130, 132, 134 as the implant progresses and the implanted dose increases, until a final dose rate 136 is reached. Final dose rate 136 remains fixed for the remainder of the implant process. The number of steps and the width and amplitude of the steps may be varied within the scope of the invention. An example wherein the dose rate increases continuously over at least a portion of the implant is shown in FIG. 4B. The dose rate increases continuously according to a dose rate curve 140 from an initial dose rate 142 to a final dose rate 144 over an initial portion of the implant, and the dose rate remains fixed for the remainder of the implant process. In FIG. 4B, the initial dose rate 142, the shape and time duration of the dose rate curve 140, and the final dose rate 144 may be varied within the scope of the invention. In each of FIGS. 4A and 4B, a similarly shaped dose rate profile would be obtained by plotting dose rate as a function of time. Dose rate variations during the implant process, such as those shown in FIGS. 4A and 4B, may be preprogrammed into implant controller 110.

In general, it is desirable to limit the fraction of the implant during which less than maximum dose rate is utilized. An extended period of less than maximum dose rate would increase the overall implant time and reduce throughput.

As an alternative to or in addition to controlling the dose rate per pulse and the time average dose rate, the instantaneous dose rate can be dynamically controlled by altering the plasma density during the implant. This control technique depends upon the method of plasma generation but includes control of the power applied to or absorbed by a plasma source, such as RF or microwave power, control of plasma confinement, such as by controlling magnetic or electrostatic elements, and control of the efficiency of ionization, such as by controlling the neutral gas density or the plasma scale length, for example, by adjusting the anode-to-cathode spacing.

Implant depth can be dynamically controlled by altering the amplitude of the implant pulse during the implant. This alters the depth profile of the implanted species, but this effect can be limited while reducing effects such as outgassing of volatile species. In addition, it may be desirable to make the plasma pulse width, in a pulsed plasma embodiment, longer than the implant pulse width to ensure adequate charge neutralization after the implant pulse. This may be accomplished using an alternative plasma source, such as hollow electrode pulse source 56 (FIG. 1), to supply neutralizing electrons.

Figure 5:
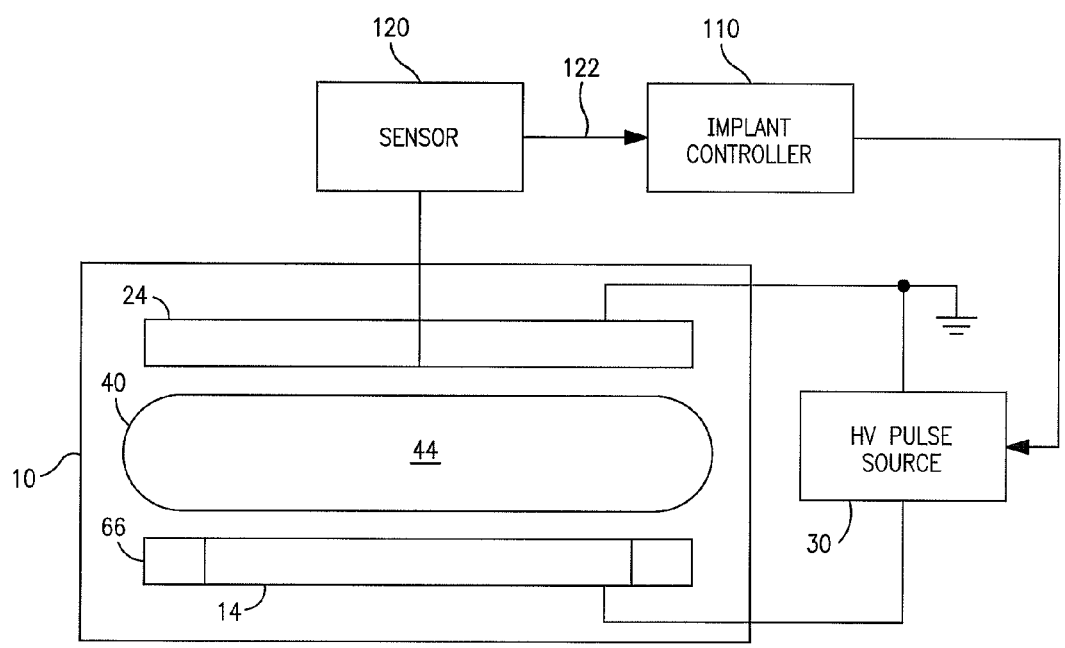
FIG. 5 is a simplified schematic block diagram of a plasma ion implantation system in accordance with a third embodiment of the invention.

A simplified schematic block diagram of a plasma ion implantation system in accordance with a third embodiment of the invention is shown in FIG. 5. A system for closed loop control of dose rate and/or ion energy is shown. Sensor 120 senses a parameter of process chamber 10 and provides sensor signal 122 to implant controller 110. In response to the sensor signal 122, implant controller 110 controls one or more parameters of pulse source 30, such as implant pulse width, implant pulse frequency and implant pulse amplitude. Sensor 120 provides feedback from the implant processing environment, such as pressure control parameters, substrate voltage, wafer bias supply current, in-situ charging monitors, optical emission spectroscopy, residual gas analysis, Fourier transform infrared based gas analysis or video analysis of the plasma discharge. It will be understood that one or more sensors may provide sensor signals to implant controller 110. Implant controller 110 may perform an analysis of the sensed parameter to determine if operation of the implantation system is within a normal operating range. If one or more of the sensed parameters is outside the normal operating range, a control signal may be provided to pulse source 30 to adjust dose rate as described above. The adjustment is selected to move operating conditions within the normal range.

Figure 6:
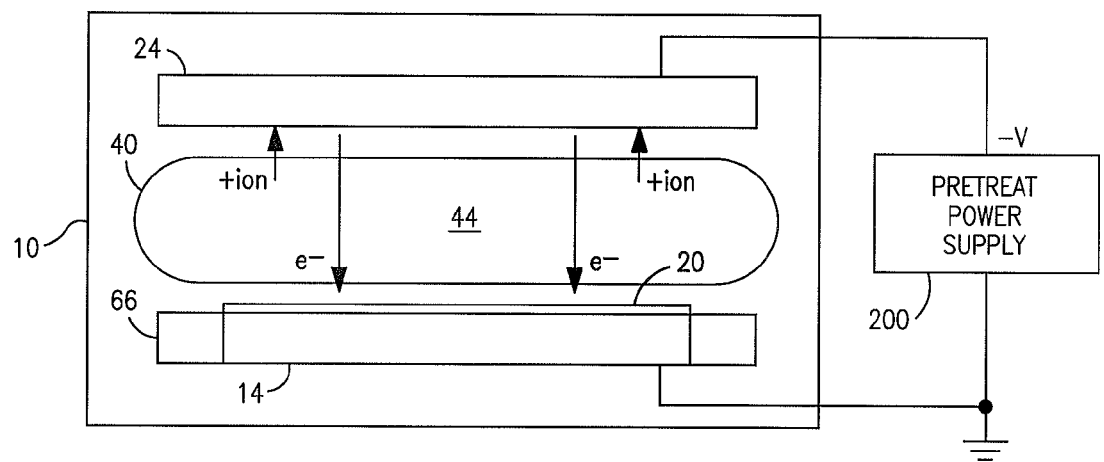
FIG. 6 is a simplified schematic block diagram of a plasma ion implantation system in accordance with a fourth embodiment of the invention.
Figure 7:
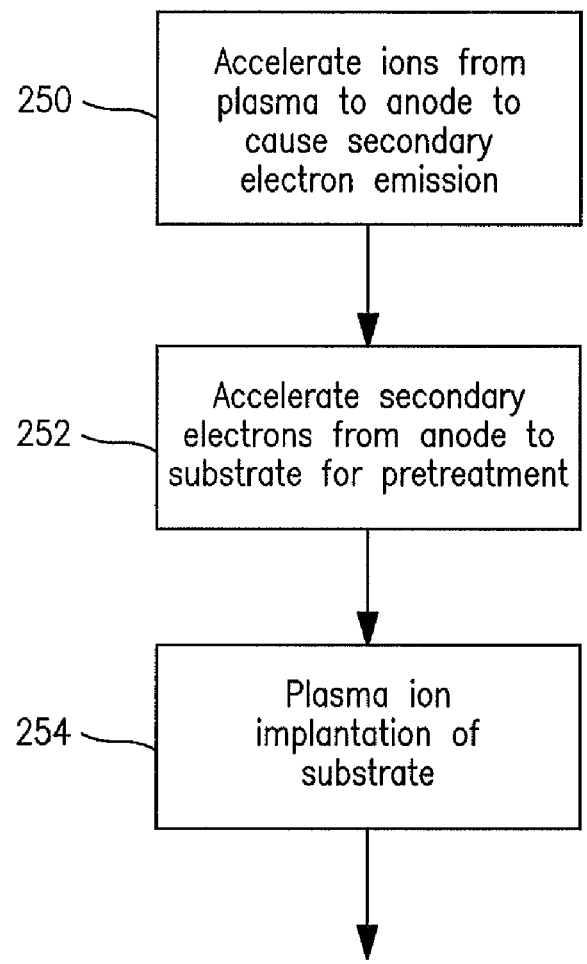
FIG. 7 is a flow diagram of a method for plasma ion implantation of a substrate according to the fourth embodiment of the invention.

A fourth embodiment of the invention is described with reference to FIGS. 6 and 7. FIG. 6 is a simplified schematic block diagram of a plasma ion implantation system configured for pretreatment of substrate 20 with secondary electrons, in accordance with the fourth embodiment of the invention. FIG. 7 is a flow chart that illustrates a method for plasma ion implantation of a substrate in accordance with the fourth embodiment of the invention.

During a pretreatment step, pulse source 30 (FIG. 1) is disconnected from anode 24 and platen 14 or is otherwise disabled. A pretreatment power supply 200 is connected to anode 24 and platen 14 such that anode 24 is negatively biased with respect to platen 14. Platen 14 may be grounded or may be positively biased. Power supply 200 may supply a negative bias voltage −V to anode 24. Plasma 40 in plasma discharge region 44 may be initiated and maintained by power supply 200 or by a separate plasma source (not shown in FIG. 6). Plasma 40 may contain ions of the dopant material for a subsequent implant or may contain ions of an inert gas. Positive ions in plasma 40 are accelerated toward and impact negatively-biased anode 24. The impact of the positive ions creates secondary electron emission from the surface of anode 24. The secondary electrons are accelerated by the negative anode bias potential toward the surface of substrate 20, which is positioned facing anode 24. The substrate can be biased or grounded, so that the net energy of the secondary electrons is the emission energy plus the difference between the anode bias and any bias applied to substrate 20. A ground reference for the system may be supplied by the substrate itself or by another grounded surface.

The energetic secondary electrons pretreat a photoresist mask on substrate 22 and reduce outgassing during the subsequent ion implant step. The secondary electrons have sufficient energy and dose that outgassing by the photoresist mask is substantially complete prior to ion implantation. This allows the ion implant to be relatively free of the effects of photoresist outgassing, minimizes exposure to low energy electrons or negatively charged ions, and allows positive ions to reach the substrate surface during electron exposure in order to neutralize electrical charge imbalance.

Suitable gas species for the pretreatment step may include, but are not limited to, $BF_3$, $AsF_5$, $N_2$, Ar, $PH_3$, $AsH_3$ and $B_2H_6$. The voltage applied to anode 24 may range from −500 volts to −20 kV. Suitable electron doses may range from 1E15 to 1E17 $cm^{-2}$.

Referring to FIG. 7, ions are accelerated from plasma 40 to anode 24 to cause secondary electron emission in step 250. As described above, positively charged ions are accelerated from plasma 40 to anode 24 by a negative bias on anode 24. The same negative bias accelerates the secondary electrons from anode 24 to substrate 20 for pretreatment of substrate 20. The secondary electron bombardment is continued until an undesired effect, such as photoresist outgassing, is substantially complete. Then, the plasma ion implantation system is configured for plasma ion implantation. For example, pretreatment power supply 200 may be disconnected or disabled, and pulse source 30 may be enabled as shown in FIG. 1 and described above. Then, plasma ion implantation of substrate 20 is performed in step 254 in accordance with a prescribed implant process. In some embodiments, a parameter of the plasma ion implantation process such as dose rate, ion energy, or both, is varied during the implant process to at least partially compensate for undesired effects of interaction between ions being implanted and the substrate. Required parameter variations may be reduced as a result of the pretreatment step. In other embodiments, the parameters of the implant process may be held constant during plasma ion implantation.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for plasma ion implantation of a substrate, comprising:

providing a plasma ion implantation system including a process chamber, a source for generating a plasma in the process chamber, a platen for holding a substrate in the process chamber, an anode spaced from the platen, and a pulse source for generating implant pulses for accelerating ions from the plasma into the substrate;

accelerating ions from the plasma to the anode to cause emission of secondary electrons from the anode;

accelerating the secondary electrons from the anode to the substrate; and plasma ion implantation of the substrate according to an implant process.

2. A method as defined in claim 1, wherein the secondary electrons have energies in a range of about 500 eV to 20 keV.

3. A method as defined in claim 1, wherein the anode is coated with an electron emissive material.

4. A method as defined in claim 1, wherein the anode is biased negatively with respect to the plasma.

5. A method as defined in claim 4, wherein the platen is grounded.

6. A method as defined in claim 4, wherein the platen is positively biased.

7. A method as defined in claim 4, wherein a hollow cathode surrounds a plasma discharge region between the anode and the plasma and wherein the hollow cathode is grounded.

* * * * *